United States Patent [19]
Cheng et al.

[11] Patent Number: 6,109,501
[45] Date of Patent: Aug. 29, 2000

[54] RADIAL WIRE BONDER AND SELECTABLE SIDE VIEW INSPECTION SYSTEM

[75] Inventors: Chi Wah Cheng; Ka On Yue; Chiu Fai Wong, all of Kowloon, The Hong Kong Special Administrative Region of the People's Republic of China

[73] Assignee: ASM Assembly Automotion Ltd., Kwai Chung, The Hong Kong Special Administrative Region of the People's Republic of China

[21] Appl. No.: 09/233,732

[22] Filed: Jan. 11, 1999

Related U.S. Application Data

[62] Division of application No. 08/745,680, Nov. 8, 1996, Pat. No. 5,897,048.

[51] Int. Cl.[7] .......................... B23K 20/10; H01L 21/607
[52] U.S. Cl. ................................... 228/1.1; 228/45
[58] Field of Search ................ 228/1.1, 4.5, 45, 228/110.1, 180.5

[56] References Cited

U.S. PATENT DOCUMENTS

| | | | |
|---|---|---|---|
| 4,759,073 | 7/1988 | Shah et al. .............................. | 382/151 |
| 4,789,093 | 12/1988 | Bansemir ................................ | 228/1.1 |
| 4,792,079 | 12/1988 | Bansemir ................................ | 228/1.1 |

OTHER PUBLICATIONS

S.M.Sze, "VLSI Technology", Copyright 1983, pp. 555–558,576.

*Primary Examiner*—Samuel M. Heinrich
*Attorney, Agent, or Firm*—Thomas E. Schatzel; Law Offices of Thomas E. Schatzel

[57] ABSTRACT

A wire bonding machine having a wire bonding head that provides five directions of movement or degrees of freedom. The radial direction of movement supports the wire bonding process and reduces the moving mass of the wire bonder during the generation of the wire bonds. The wire bonding machine further includes a selectable side view inspection system. Through a group of optical components, the assembly process can be selectively viewed from either a side view or a top view. The side view of the assembly process provides for improved analysis of the wire bond quality which can be monitored by a camera.

7 Claims, 5 Drawing Sheets

*Fig_1F (PRIOR ART)*

*Fig_2*

Fig. 3

Fig_4

Fig_5

Fig_6

Fig_7 and Y axis movements position the semi-
RADIAL WIRE BONDER AND SELECTABLE SIDE VIEW INSPECTION SYSTEM This is a divisional of application Ser. No. 08/745,680 now U.S. Pat. No. 5,897,048, filed on Nov. 08, 1996.

BACKGROUND OF THE INVENTION

1. Field of the Invention

This invention relates generally to semiconductor device manufacturing, and more particularly, to wire bonding machines.

2. Description of the Prior Art

Figure 1A:
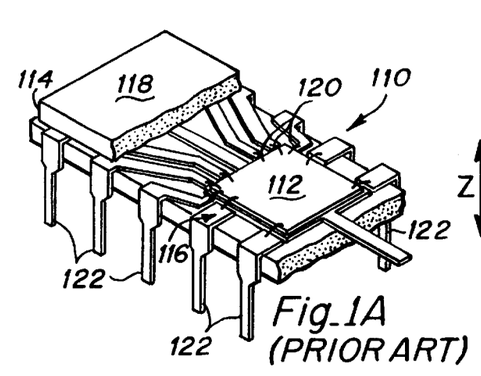
FIG. 1A is a cutaway view of a prior art dual inline pin plastic integrated circuit package.

In manufacturing a semiconductor device, such as an semiconductor device 110 as illustrated in FIG. 1A, packaging is often required so that the signals can be bidirectionally communicated between the semiconductor device and other electronic devices. Semiconductor device 110 includes a semiconductor die or substrate 112 inserted or molded into a package 114 so that the semiconductor device may be installed onto a printed circuit board (not illustrated). The package 114 further provides a metal leadframe 116 so that electrical signals may be communicated between the semiconductor die 112 and the printed circuit board and other integrated circuits 110 or electronic components.

Referring to FIG. 1A, the semiconductor device 110 includes the dual inline pin package 114, the semiconductor die 112, the metal leadframe 116, a molded compound shell 118, and bond wires 120. The bond wires 120 are made of a conducting material, preferably gold or aluminum, and couple to the semiconductor die 112 at one end and the leadframe 116 at the opposite end. The traces of the lead frame that couple to the printed circuit board are often referred to as pins 122.

Figure 1B:
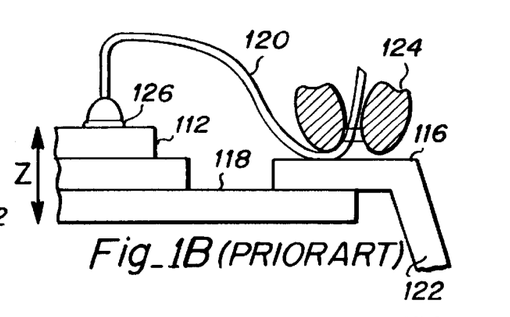
FIG. 1B is a magnified cross sectional side view of a bonding tool generating a prior art ball-wedge bond.
Figure 1C:
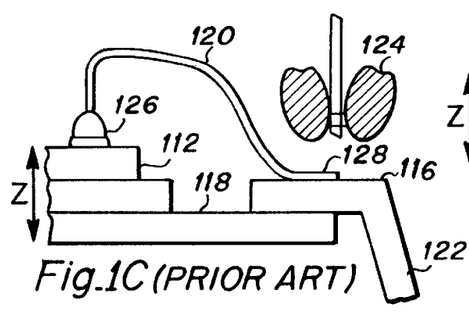
FIG. 1C is a magnified cross sectional side view of a completed prior art ball-wedge bond.

In the semiconductor device manufacturing process a wire bonding machine (not illustrated in FIG. 1A) couples the bond wires 120 to the semiconductor die 112 and the leadframe 116. Referring to FIG. 1B, a bonding tool 124 of the wire bonding machine generates a ball bond 126 between the bond wire 120 and the semiconductor die 112. The bonding tool 124 is coupled to a bonding head (not illustrated in FIG. 1B) of the wire bonding machine. Referring to FIG. 1C, the bonding tool 124 has completed a wedge bond 128 between the bond wire 120 and the leadframe 116.

Generally thermosonic bonding techniques of bonding may be used to generate the ball bond 126. Thermosonic bonding utilizes a heat source to heat one end of the bond wire 120 to generate a ball and simultaneously applies a vertical load to the ball while ultrasonically exciting the bond wire 120. Generally ultrasonic bonding techniques are used to generate the wedge bond 128. In generating the wedge bond, the bond wire 120 is first wedged between the leadframe 116 or other bonding surface and the bonding tool 124 as illustrated in FIG. 1B. While the bond wire 120 is under a vertical load, a mechanical motion or pulsing of the bonding tool 124 generates an ultrasonic wave motion generating sufficient energy to heat the end of the bond wire 120 breaking surface oxides on the bonding surface and at the end of the bond wire so that the new surfaces may cold-weld together. Proper loading and ultrasonic wave motion must occur for the wedge bond 128 to be properly formed.

Figure 1D:
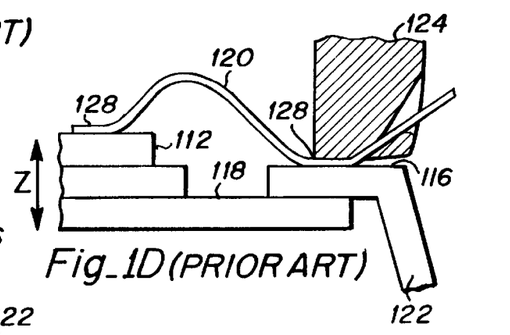
FIG. 1D is a magnified cross sectional side view of a completed prior art wedge-wedge bond.

The bonding of the bond wire 120 in FIG. 1C is referred to as ball-wedge bonding. In the case where a wedge bond 128 is formed at both ends of the bond wire 120, it is referred to as wedge-wedge bonding. FIG. 1D illustrates wedge-wedge bonding of the bond wire 120. A wedge bond 128 is formed at the end of the bond wire 120 attached to the semiconductor die 112 and a second wedge bond 128 is formed at the end of the bond wire 120 attached to the leadframe 116. Wedge-wedge bonding may be preferable such that thermosonic bonding techniques of ball bonding may be avoided. In ball-wedge bonding the bonding tool 124 may be a capillary device. In wedge-wedge bonding the bonding tool 124 may be a wedge device.

Figure 1E:
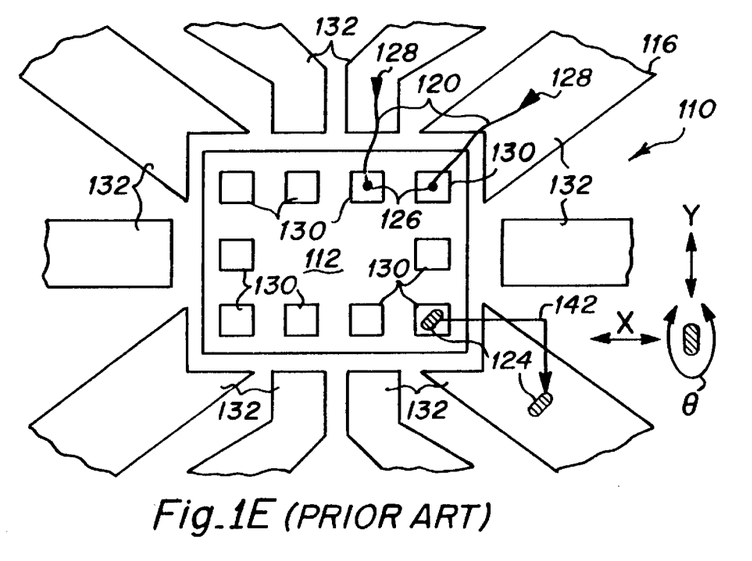
FIG. 1E is a magnified top view of a prior art semiconductor die and package leadframe illustrating the wire bonding process of prior art ball-wedge wire bonders.
Figure 1F:
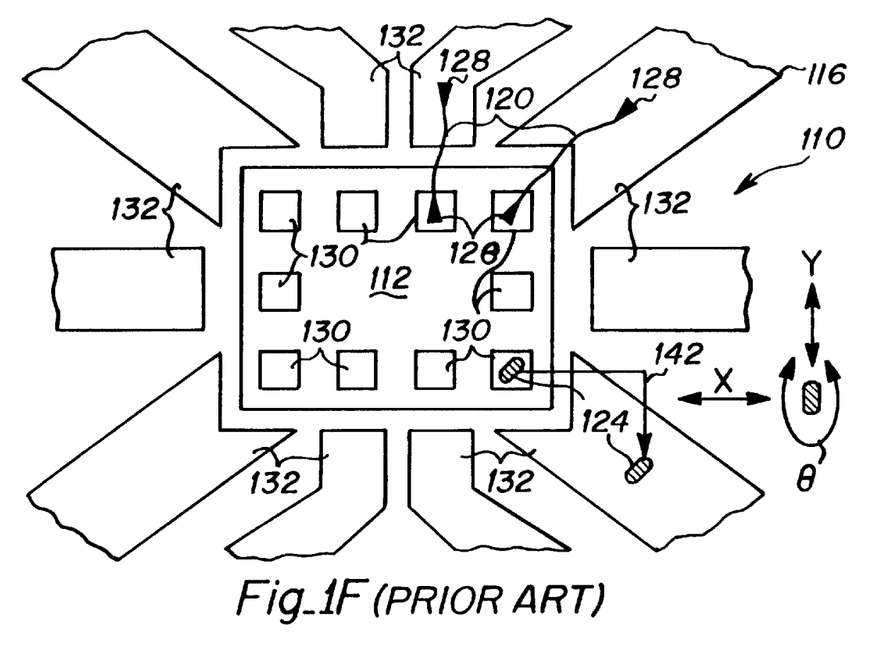
FIG. 1F is a magnified top view of a prior art semiconductor die and package leadframe illustrating the wire bonding process of prior art wedge-wedge wire bonders.

Referring to FIG. 1E, the semiconductor device 110 includes the semiconductor die 112 and the leadframe 116. FIG. 1E illustrates ball-wedge bonding. The semiconductor die 112 includes bonding pads 130 so that the bonding wires 120 may be attached thereto using ball bonds 126. The surface of the bonding pads 130 are made of a conductive material which is preferably aluminum metal. The leadframe 116 includes contact points 132 such that the bonding wires 120 may be attached thereto using wedge bonds 128. FIG. 1F illustrates wedge-wedge bonding. The bonding wires 120 are attached to the bonding pads 130 of the semiconductor die 112 using wedge bonds 128. The bonding wires 120 are attached to the contact points 132 of the lead frame 116 using wedge bonds 128.

In order to bond to all bonding pads 130 of the semiconductor die 112 and to all the contact points 132 on the leadframe 116, the bonding tool 124 must be properly positioned. Previously the proper position of the bonding tool was accomplished by physically moving the bonding tool 124 itself from one point to another point while the semiconductor device remained fixed, physically moving the semiconductor device 110 while the bonding tool 124 remained fixed, or moving both the bonding tool 124 and the semiconductor device 110. Furthermore in wedge-wedge bonding, the bond wire connection path must be aligned with the wire feeding direction of the bonding tool.

Previously automatic wedge wire bonders provided four axis of motion namely X, Y, Z, and θ (theta) to perform wire bonding. The X and Y axis movements position the semiconductor bonding pads 130 of the semiconductor die 112 under the bonding tool 124 or position the contact points 132 of the leadframe 116 to be under the bonding tool 124. Traditionally, the X and Y axis movements further define the locus of the wire path from the bonding pad 130 to the contact point 132. The θ rotational axis of movement aligns the wire feed direction of the bonding tool 124 with the wire path. Referring to FIG. 1C, the Z vertical axis of movement provides that the bonding tool 124 with its wedge makes contact with the bond wire 120 which in turn makes contact with the bonding pads 130 or contact points 132 such that the welding process may occur.

In order to perform the wire bonding process previous wire bonders may move the semiconductor device 110 or the bonding head coupled to the bonding tool 124 in various ways. In one case the semiconductor device 110 is moved in the X, Y, and θ axis while the bonding head and bonding tool 124 are moved only in the Z axis. In another case the semiconductor device 110 is moved in the X and Y axis while the bonding head and bonding tool 124 are moved in the θ axis and the Z axis. In another case the semiconductor device 110 is moved only in the θ axis while the bonding head and bonding tool 124 are moved in the X, Y, and Z axis. In another case the semiconductor device 110 is moved only in the Z axis while the bonding head and bonding tool 124 are moved in the X, Y, and θ axis. In another case the semiconductor device 110 is moved in the Z and θ axis while the bonding head and bonding tool 124 are moved in the X and Y axis. In another case the semiconductor device 110 is stationary during the bonding process while the bonding head and bonding tool 124 are moved in the X, Y, θ, and Z axis.

In order to increase the efficiency of the wire bonding process, it is desirable to handle the semiconductor devices using an automatic continuous indexing technique. Automatic continuous indexing is a technique where an index mark on the semiconductor device 110 or a device carrier (not illustrated) is used to automatically align a bonding start point as the next semiconductor device is inserted into the wire bonder for bonding. Wire bonding machines that move the semiconductor device 110 in order to position it under the bonding tool 124, can hardly use an automatic continuous index handling method. It is desirable to provide automatic continuous index handling such that the semiconductor devices 110 are stationary during the bonding process.

Semiconductor devices 110 of today may be much larger and may require a large number of pins 122 in order to communicate properly with a printed circuit board. These large devices have a relatively large mass and generally require a heavy workholder clamp in order to hold the semiconductor device 110 in the bonding machine. In wire bonders such as these where the semiconductor device 110 is moved, the large mass of the workholder clamp and the large semiconductor devices 110 result in poor dynamic stability and vibrations during a high speed bonding process. A prior technique used to combat the vibration problems in wire bonders reduces the bonding speed such that proper dynamic stability may be achieved. However, it is desirable to operate wire bonding machines at their maximum bonding speed when bonding large devices. It is also desirable to keep the semiconductor device 110 stationary during the wire bonding process.

In wire bonders where the semiconductor device 110 is stationary while the bonding head and bonding tool 124 are moved in the X, Y, θ, and Z axis, the bonding head is rather complicated and has a relatively large mass. The large mass of the bonding head makes it difficult to achieve good dynamic stability. This is particularly a problem when the bonding head and bonding tool 124 move in the X and Y axis directions from the semiconductor device bonding pad 130 to the contact points 132 as illustrated by the arrow 142 in FIG. 1E and FIG. 1F. A prior technique used to provide proper dynamic stability is to reduce the speed of the bonding process. However, it is desirable to speed up the bonding process of semiconductor devices in order to increase the throughput and thereby lowering manufacturing costs.

In the wire bonding process it is desirable to occasionally view the progress of the wire bonder in order to maintain quality controls. Traditionally a microscope (not illustrated) is used to visualize the real time wire-bonding process. The microscope may be coupled to the bonder and aligned such that its lens points to the device to allow visual inspection of the top surface of semiconductor die 112 and leadframe 116. In wire bonders where the bonding head and bonding tool 124 move and rotate in various directions it is difficult if not impossible to properly view the wire bonding process. However, it is desirable to properly view the bonding process in the case where the bonding head and bonding tool 124 move in order to complete the bonding process.

SUMMARY OF THE INVENTION

It is an object of the present invention to keep the device being assembled under a bonding head stationary while performing a wire bonding process.

Another object of the present invention is to provide a radial axis of motion for the wire bonding process.

A still further object of the present invention is to provide a selectable side view inspection system.

Briefly, a preferred embodiment of the present invention includes a wire bonding machine having a wire bonding head that provides five directions of movement or degrees of freedom. The radial direction of movement supports the wire bonding process and reduces the moving mass of the wire bonder during the generation of the wire bonds. A selectable side view inspection system may be included. Through a group of optical components, the assembly process can be selectively viewed from either a side view or a top view. The side view of the assembly process may be selectively monitored by a camera which may be also selected to view the top view.

An advantage of the present invention is that the wire bonding process can be performed at an increased rate of speed and continue to support automatic handling systems.

Another advantage of the present invention is that the moving mass of the wire bonder during the wire bonding process is reduced thereby improving the dynamic stability.

A further advantage of the present invention is that the quality of a wire bond can be better analyzed during the actual wire bonding process.

These and other objects and advantages of the present invention will no doubt become obvious to those of ordinary skill in the art after having read the following detailed description of the preferred embodiments which are illustrated in the various drawing figures.

DETAILED DESCRIPTION OF THE PREFERRED EMBODIMENT

A first embodiment of the present invention includes a bonding head of a wire bonding machine having an additional axis of motion. A second embodiment of the present invention includes a side viewing optical system for viewing in real time the wire bonding process of a wire bonding machine.

Figure 2:
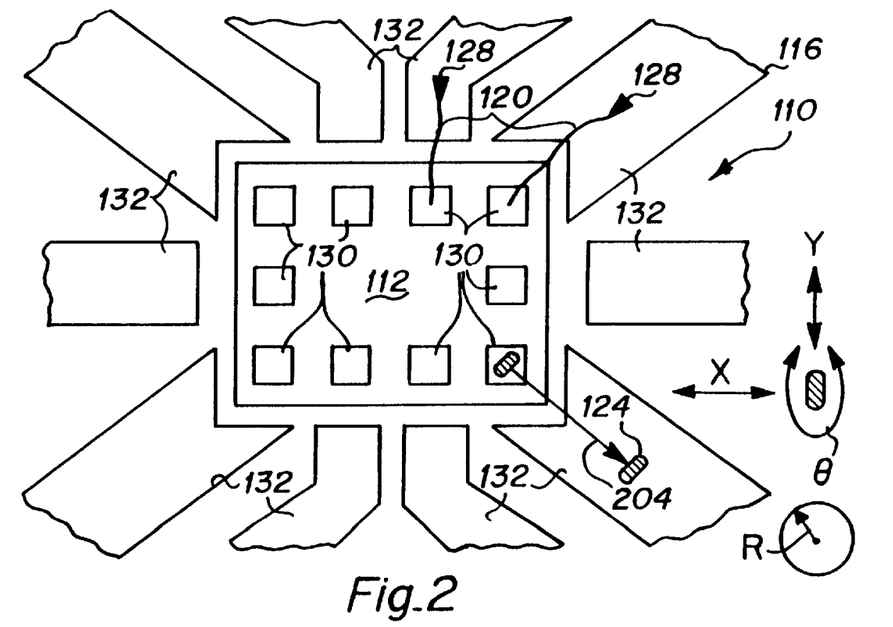
FIG. 2 is a magnified top view of a semiconductor die and package leadframe illustrating the wire bonding process of the present invention.

Referring to FIG. 2, the first embodiment of the present invention provides a radial axis or direction of movement R in the bonding head from a fixed X axis and Y axis position. The radial axis is along the bonding path from the bonding pad 130 of the semiconductor die 112 to the contact point 132 such as illustrated by an arrow 204. The bonding head provides that the bonding tool 124 or other bonding instruments can move radially from the bonding pad 130 to the contact points 132 of the leadframe 116 along the radial axis R.

Figure 3:
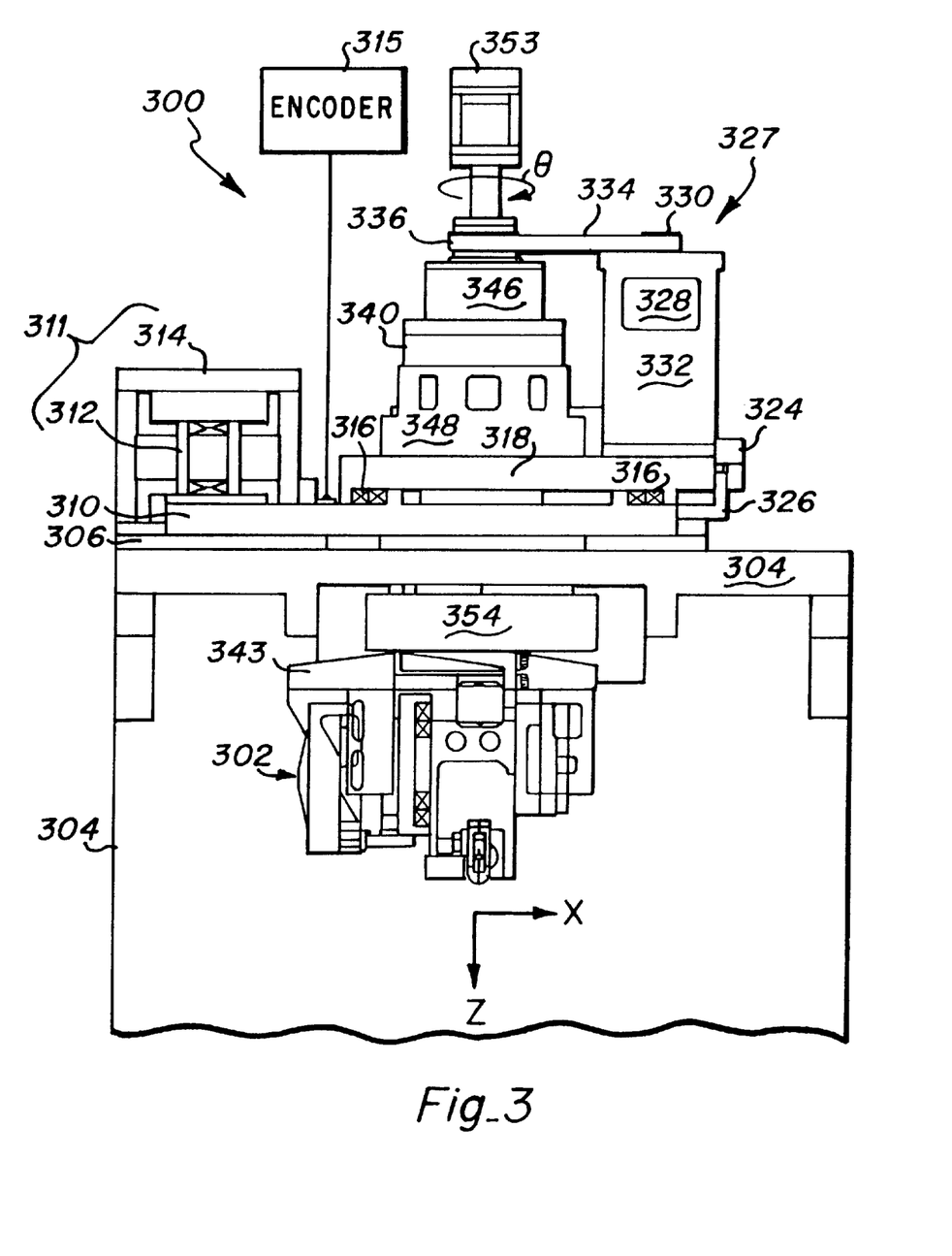
FIG. 3 is a frontal view a wire bonding machine of the present invention.
Figure 4:
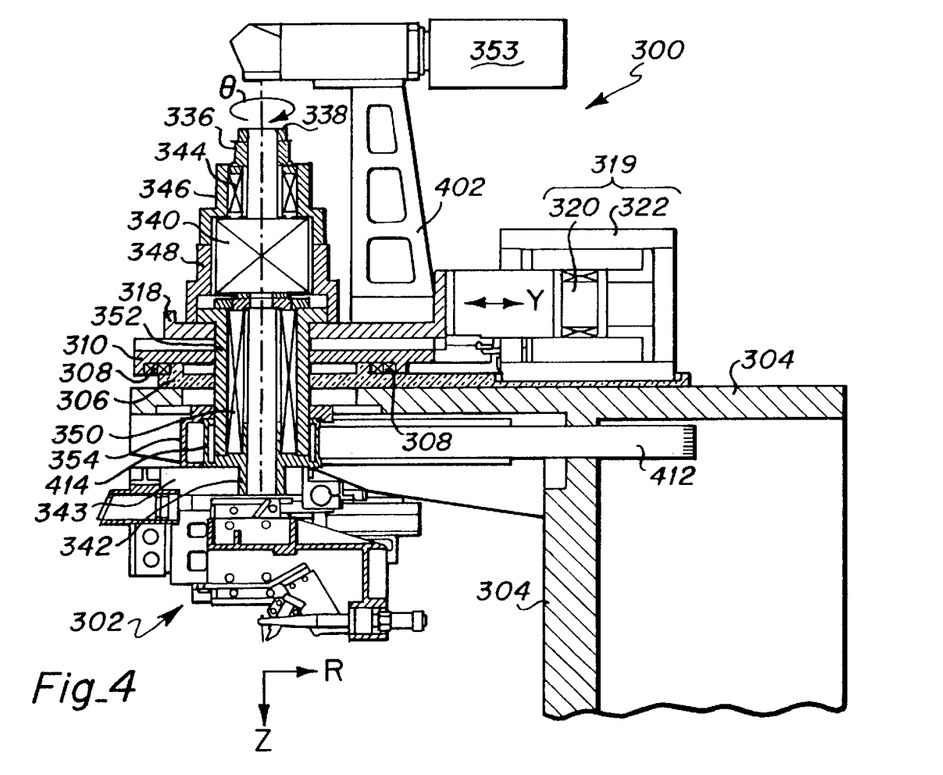
FIG. 4 is a cross sectional side view of the wire bonding machine of FIG. 3.

Referring to FIG. 3 and FIG. 4, the wire bonder of the present invention is referred to herein by the general reference character 300. Wire bonder 300 is preferably a wedge type wire bonder and provides for five directional movements. Wire bonder 300 includes a bonding head 302 that moves in five directions X, Y, θ, Z, and radial R. The bonding head 302 is supported above the semiconductor device 110 (not illustrated in FIG. 3) by a bonding head stand 304. Coupled to the bonding head stand 304 is an X–Y table base 306 having X-direction table linear guides 308 at opposite ends.

Referring to FIG. 4, the X–Y table base 306 has a pair of X-direction table linear guides 308 at opposite ends. An X-direction table plate 310, having nearly matching linear guides 308, is supported by the X–Y table base 306 at the X-direction table linear guides 308. The X-direction table linear guides 308 allow the X-direction table plate 310 to slide on the X–Y table base 306 along the X axis. Referring to FIG. 3, motion of the X-direction table plate 310 over the X–Y table base 306 is provided by an X-direction actuator 311. The X-direction actuator may include a voice coil 312 and an X-direction linear motor assembly 314. The X-direction linear motor assembly 314 is coupled to the X–Y table base 306 while the voice coil 312 is coupled to the X-direction table plate 310. A force generated between the voice coil 312 and the linear motor assembly 314 moves the table plate 310 over the table base 306. Motion of the X-direction table plate 310 over the X–Y table base 306 is recorded by an X-direction linear encoder 315 in order that a desired X coordinate position may be achieved.

Referring to FIG. 3, the X-direction table plate 310 includes a pair of Y-direction table linear guides 316 at opposite ends. A Y-direction table plate 318, having nearly matching linear guides 316, is supported by the X-direction table plate 310 at the Y-direction table linear guides 316. Referring to FIG. 4, the Y-direction table linear guides 316 allow the Y-direction table plate 318 to slide on the X-direction table plate 310 in the Y-direction. Motion of the Y-direction table plate 318 over the X-direction table plate 310 is provided by a Y-direction actuator 319. The Y-direction actuator 319 may include a Y-direction voice coil 320 and a Y-direction linear motor assembly 322. The Y-direction linear motor assembly is coupled to the X–Y table base 306 while the Y-direction voice coil 320 is coupled to the Y-direction table plate 318. A force generated between the voice coil 320 and the motor assembly 322 moves the Y-direction table plate 318 over the X-direction table plate 310. The Y-direction voice coil 320 allows for movement of the Y-table plate 318 in the X direction such that it can move freely over the range of X and Y axis movement. In this manner the Y-direction linear motor assembly 322 can be stationarily coupled to the X–Y table base 306. Referring to FIG. 3, motion of the Y-direction table plate 318 over the X-direction table plate 310 is recorded by a Y-direction linear encoder 324 in order that a desired Y coordinate position may be achieved. The linear encoder 324 is coupled to a Y-encoder bracket 326 which is coupled to the X-direction table plate 310.

Referring to FIG. 3, a theta actuator 327 rotates the bonding head 302 to the proper angular θ direction. The theta actuator 327 may include a theta motor 328 having a theta drive pulley 330. The theta motor 328 is coupled to a theta motor stand 332 which is in turn coupled to the Y-direction table plate 318. The theta drive pulley 330 is coupled to an output shaft of the theta motor 328. The theta drive pulley 330 is coupled to a theta belt 334 which is in turn coupled to a theta input pulley 336. Referring to FIG. 4, the theta input pulley 336 is coupled near a top end of a theta input shaft 338. A lower end of the theta input shaft 338 is coupled to a gearing system 340 which is in turn coupled to an end of a main shaft 342. Coupled at an opposite end of the main shaft 342 is a turning plate 343 of the bonding head 302. The gearing system 340 provides a selective reduction in the angular movement from the theta input shaft 338 to the main shaft 342. Referring to FIGS. 3 and 4, the theta input shaft 338 is surrounded by an input shaft side bearing 344 which is encased by an input shaft bearing housing 346. The gearing system 340 is partially encased by a gearing housing 348. Referring to FIG. 4, the main shaft 342 is surrounded by a main shaft bearing 350 which is in turn encased by a main shaft bearing housing 352. The input shaft side bearing 344 and the main shaft bearing 350 allow rotational movement respectively in the input shaft 338 and the main shaft 342. The input shaft bearing housing 346 is coupled to the gearing housing 348 which is in turn coupled to the Y-direction table plate 318. The main shaft bearing housing 352 is coupled to the Y-direction table plate 318 to support the main shaft 342 in an axial position.

Figure 5:
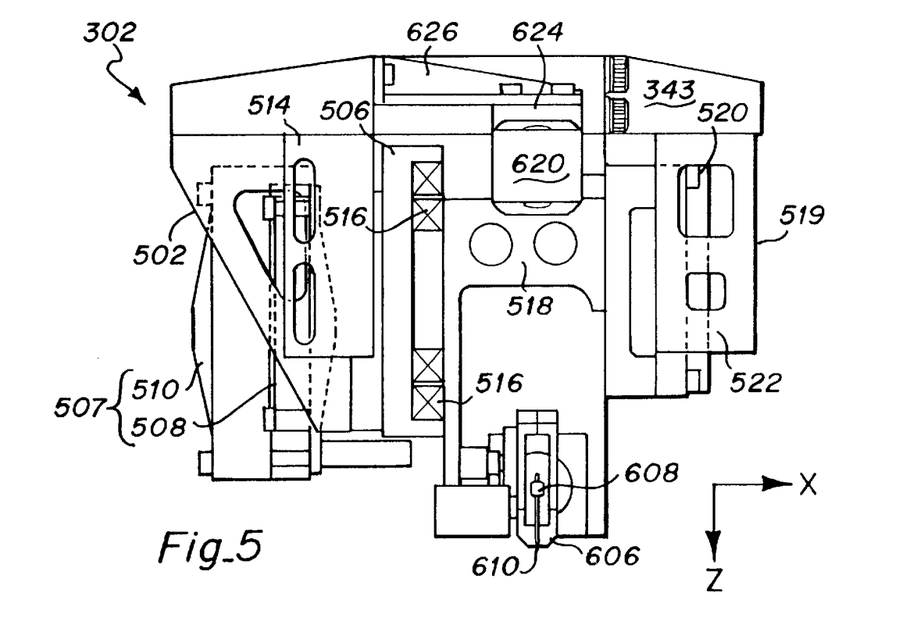
FIG. 5 is a magnified frontal view of the bonding head of FIG. 3.
Figure 6:
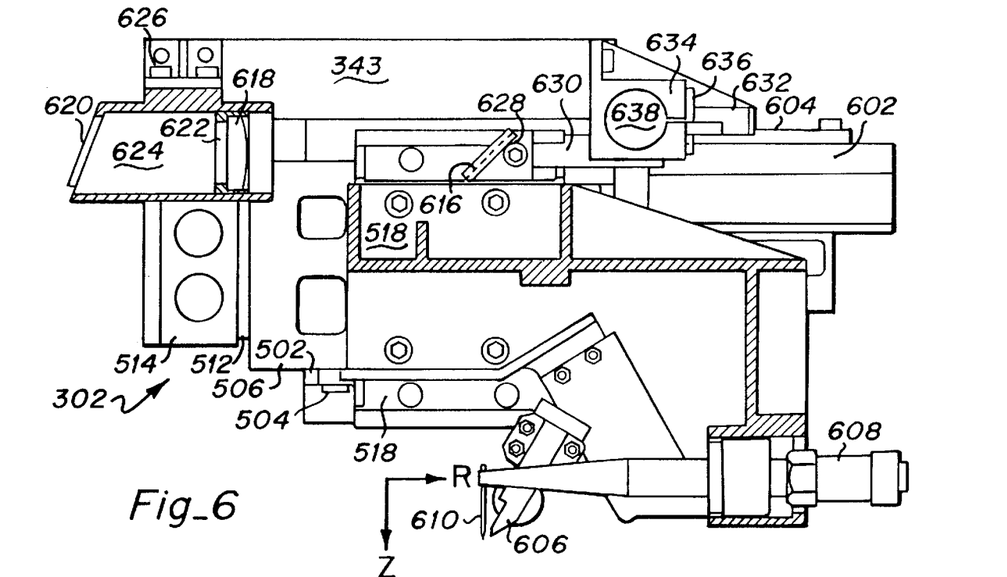
FIG. 6 is a cross sectional side view of the bonding head of FIG. 5.
Figure 7:
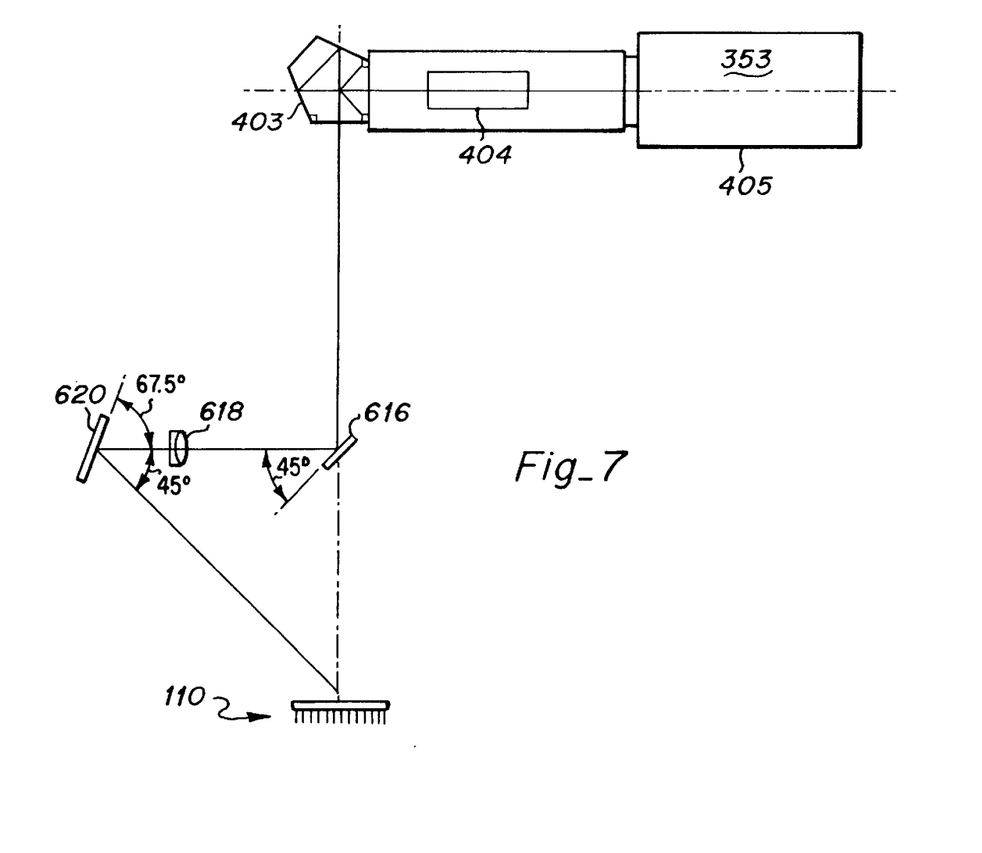
FIG. 7 is a schematic drawing illustrating a side-view inspection system of the present invention.

The turning plate 343 coupled to the end of the main shaft 342 supports the bonding head 302 above the semiconductor device 110 (not illustrated in FIGS. 3,4,5,and 6). As illustrated in FIGS. 3 and 4, the wire bonder 300 may include a coaxial optical assembly 353 for viewing the bonding operation in real time. As illustrated in FIG. 7, the coaxial optical assembly 353 is supported by an optics stand 402 which is in turn coupled at its base to the Y-direction table plate 318. The coaxial optical assembly 353 includes a penta prism 403, a lens system 404, and a camera 405. The wire bonder 300 further includes a bonding head cable housing 354 that encases a flat cable 412 which may be similar to a ribbon type cable having a multiple of conductors for signal, power, and ground lines. The cable 412 carries the appropriate signals to operate the bonding head 302. The flat cable 412 may be wrapped around a cable spool 414 which is coupled to the turning plate 343. The bonding head cable housing 354 is coupled to the main shaft bearing housing 352. Referring to FIGS. 5 and 6, a bonding head support bracket 502 is coupled to the turning plate 343. The bonding head support bracket includes a pair of Z-direction linear guides 504 vertically positioned.

A Z-sliding plate 506, having nearly matching linear guides 504, is supported by the bonding head support bracket 502 at the Z-direction linear guides 504. The Z-direction linear guides 504 allow the Z-sliding plate 506 to vertically slide against the bonding head support bracket 502 in the Z direction. Referring to FIG. 5, motion of the Z-sliding plate 506 against the bonding head support bracket 502 is provided by a Z-direction actuator 507. The Z-direction actuator 507 may include a Z-direction voice coil 508 and a Z-direction linear motor assembly 510. The Z-direction linear motor assembly 510 is coupled to the bonding head support bracket 502 while the Z-direction voice coil 508 is coupled to the Z-sliding plate 506. A force generated between the voice coil 508 and the motor assembly 510 moves the Z-sliding plate 506 vertically while the bonding head support bracket 502 remains vertically fixed. As shown in FIGS. 5 and 6, the vertical motion of the Z-sliding plate 506 is recorded by a Z-direction linear encoder 512 in order that a desired Z coordinate position may be achieved. The linear encoder 512 is coupled to a Z-direction encoder bracket 514 which is in turn coupled to the turning plate 343. Referring to FIG. 5, the Z-sliding plate 506 includes a pair of radial direction linear guides 516 horizontally coupled respectively near a top and lower edge of the plate 506.

A bonding head subassembly 518, having nearly matching linear guides 516, is supported by the Z-sliding plate 506 at the radial direction linear guides 516. The radial direction linear guides 516 allow the bonding head subassembly 518 to horizontally slide against the Z-sliding plate 506 such that it slides in a radial direction R. Motion of the bonding head subassembly 518 against the Z-sliding plate 506 is provided by a radial-direction actuator 519. The radial-direction actuator 519 may include a horizontally mounted radial-direction voice coil 520 and a radial-direction linear motor assembly 522. The radial-direction linear motor assembly 522 is coupled to the turning plate 343 while the radial-direction voice coil 520 is coupled to the bonding head subassembly 518. A force generated between the voice coil 520 and the motor assembly 522 moves the bonding head subassembly 518 horizontally against the Z-sliding plate 506. Additionally, the radial-direction voice coil 520 allows for movement of the bonding head subassembly 518 in the Z direction axis such that it can move freely over the range of Z and radial axis movement. In this manner the radial-direction linear motor assembly 522 can be stationarily coupled to the turning plate 343. Referring to FIG. 6, motion of the bonding head subassembly 518 against the Z-sliding plate 506 in the radial direction R is recorded by a X radial-direction linear encoder 602 in order that proper radial positions may be achieved. The radial motion of the bonding head subassembly 506 further improves the wire bonding process. The linear encoder 602 is coupled to a radial-direction encoder bracket 604 which is coupled to the Z-sliding plate 506.

In order to perform the wire bonding operation the bonding head subassembly 518 includes bonding instruments such as a wire clamp 606 and a transducer 608. In order to perform wedge bonding the bonding head subassembly 518 includes a bonding wedge 610. The bonding wedge 610 and the wire clamp 606 provide similar capability as the bonding tool 124 but do not perform ball bonding. Other devices may be connected to the bonding head subassembly 518 in order to perform a different wire bonding technique or other steps in an assembly process for electrical devices.

The wire bonder 300 utilizes the X-direction actuator 311 and the Y-direction actuator 319 to position the bonding wedge 610 over a bonding pad 130. The theta actuator 327 rotates the bonding head subassembly 518 so that the wire path is aligned with the wire feeding direction from the wire clamp 606. In this manner the bonding wedge 610 is also aligned with the wire path. The radial-direction actuator 519 is operated to move the bonding head subassembly 518 to its home or initialization position. The Z-direction actuator 507 moves the bonding head subassembly 518 downward towards the bonding pad 130 to effectuate a bond. The bonding instruments such as the bonding wedge 610, wire clamp 606, and transducer 608 complete the bond of the wire 120 at one end. The Z-direction actuator 507 moves the bonding head subassembly 518 upward and away from the completed bond at the bonding pad 130. The radial-direction actuator 519 moves the bonding head subassembly 518 on the radial path 204 to a point above the contact point 132 of the leadframe 116. The Z-direction actuator 507 moves the bonding head subassembly 518 downward towards the contact point 132 to effectuate a bond. The bonding instruments such as the bonding wedge 610, wire clamp 606, and transducer 608 complete the bond of the wire 120 at the second end and cuts the wire 120. Then the Z-direction actuator 507 moves the bonding head subassembly 518 upward and away from the completed bond at the contact point 132 of the leadframe 116. The foregoing sequence of steps are repeated to effectuate wire bonds to the desired bonding pads 130 and contact points 132.

Because the wire bonder 300 has the bonding head 302 perform all motions of the assembly process while the semiconductor device 110 remains stationary, the space underneath may be utilized for transporting the device 110 after completion of the assembly process. Additionally because the bonding head 302 performs all motions of the assembly process, the mass and inertia during the wire bonding process are constant such that the size of the device 110 is irrelevant in how fast a bonding head 302 may move. Because the bonding head subassembly 518 moves along the radial axis R, the bonding head 302 does not need to move along the wire path. The radial axis movement decreases the time required to make a bond. Thus the movement of the bonding head 302 in the X–Y direction is less important and may be slowed to improve dynamic stability.

Referring to FIGS. 6 and 7, a selectable side view inspection system is provided. Providing a side view of the wire bonding process allows an operator to further examine the quality of the wire bonds. An operator can determine if the Z-direction actuator 507 is properly positioning the bonding head subassembly 518 for bonding. The operator can further examine if the bonding instruments are operating properly, particularly the transducer 608. Examining the side view of the wire bond provides an opportunity to automate the quality control process by feeding the side view to a computerized inspection system. The selectable side view inspection system may also be adapted to other assembly processes particularly in the assembly of other electronic components or systems.

The major optical components of the side view inspection system include the coaxial optical assembly 353, a central mirror 616, a side view lens 618, and a side view mirror 620. Side view mirror 620 being tilted at an angle of sixty-seven and one-half degrees from the horizontal plane, views the object that is being assembled, such as the semiconductor device 110, at a forty-five degree angle. The light received by the side view mirror 620 is reflected horizontally through the side view lens 618 and to the central mirror 616. Central mirror 616 being tilted at an angle of forty five degrees from a horizontal plane, reflects the light received through the side view lens 618 at a right angle vertically towards the penta prism 403. The side view lens 618 may move horizontally along the ray reflected light in order to properly focus the image. The light directed towards the camera 405 is bent at a ninety degree angle from the vertical plane through the penta prism 403 and focused by the lens system 404. In this manner a side view of an object that is near the assembly instruments such as the bonding wedge 610 may be provided. If central mirror 616 is allowed to horizontally move out of the vertical line of sight of the penta prism 403, the coaxial vertical view may be received by the camera.

The optical components of the side view inspection system may be coupled to an assembly machine such as the wire bonder 300. Referring to FIG. 6, side view lens 618 is coupled to a lens holder 622. The side view lens 618 and lens holder 622 are encased within a side view inspection lens and mirror housing 624. The lens 618 and holder 622 may slide within the lens and mirror housing 624 in order to adjust the focus of the image. The lens and mirror housing 624 is coupled to a side inspection housing bracket 626 which in turn is coupled to the turning plate 343. The side view mirror 620 is coupled to one side of the lens and mirror housing 624.

Central mirror 616 is coupled to a mirror holder 628 having a forty-five degree inclination with the horizon. Mirror holder 628 is coupled to a rack 630. A linear guide holder 632 and a motor bracket 634 are coupled to the turning plate 343. A linear motion guide 636 is coupled to the linear guide holder 632. The mirror holder 628 is supported by the linear motion guide 636 such that the holder 628 may horizontally slide against the linear motion guide 636. A gear motor 638 is coupled to the motor bracket 634 in order to provide motion for the central mirror 616. A pinion gear (not illustrated) is coupled to an output shaft of the gear motor 638. The pinion gear of the gear motor 638 linearly drives the rack 630 such that the central mirror 616 moves in a horizontal fashion.

The horizontal movement in the central mirror 616 selects whether a top view or a side view is selected. A top view image would appear somewhat similar to the illustration depicted in FIG. 2. A side view image would appear somewhat similar to the illustration depicted in FIGS. 1B and 1C. If a top view (also referred to as a coaxial view or vertical view) of the device under assembly is desired, the central mirror 616 is horizontally moved out of the vertical line of sight. If a side view is desired, the central mirror 616 is moved horizontally to a proper position in order to reflect the received light. In this manner one camera is utilized to provide two different views of the object that is undergoing assembly. Because the side view optics are mounted to the bonding head 302, the side view image provided moves and rotates with the bonding head 302. Thus a side view may be provided in any X or Y position and any θ orientation.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A radial wire bonder (300) having a radial motion for coupling bonding wires (120) to bonding pads (130) of a semiconductor (112) and to contact points (132), the radial wire bonder (300) comprising:

bonding instruments (606, 608, or 610) for coupling one end of the bonding wires (120) to the bonding pads (130) and an opposite end of the bonding wires (120) to the contact points (132);

a bonding head subassembly (518) coupled to the bonding instruments (606, 608, or 610) having a first radial direction linear guide (516) near one horizontal edge and a second radial direction linear guide (516) near an opposite horizontal edge;

a first plate (506) having a third radial direction linear guide (516) near one horizontal edge loosely coupled to said first radial direction linear guide (516) and a fourth radial linear direction guide (516) loosely coupled to said second radial direction linear guide (516) near an opposite horizontal edge such that the bonding head subassembly (518) may horizontally slide against the first plate (506);

a turning plate (343) for supporting the bonding head subassembly (518) above the semiconductor (112); and a first actuator (519) coupled to the turning plate (343) for horizontally sliding the bonding head subassembly (518) against the first plate (506) along radial paths between the bonding pads (130) and the contact points (132).

2. The radial wire bonder of claim 1 wherein, the first plate (506) is a Z-sliding plate (506) having a first vertical linear guide (504) near a vertical edge and a second vertical linear guide (504) near an opposite vertical edge; and the radial wire bonder (300) further comprises:

a support bracket (502) coupled to the turning plate (343) at a top end and having a third vertical linear guide (504) near a vertical edge loosely coupled to said first vertical linear guide (504) and a fourth vertical linear guide (504) near an opposite vertical edge loosely coupled to said second vertical linear guide (504) such that the Z-sliding plate (506) may vertically slide against the support bracket (502); and a second actuator (507) coupled to the support bracket (502) for vertically sliding the Z-sliding plate (506) against the support bracket (502).

3. The radial wire bonder of claim 1 wherein the radial wire bonder (300) further comprises:

a second actuator (327) coupled to the turning plate (343) for rotating the bonding head (302) into alignment with a wire path from a bonding pad (130) to a contact point (132).

4. The radial wire bonder of claim 1 wherein the radial wire bonder (300) further comprises:

a table base (306) having a first horizontal linear guide (308) near a first edge and a second horizontal linear guide (308) near an edge opposite said first edge;

a second plate (310) having a third horizontal linear guide (308) near one edge loosely coupled to said first horizontal linear guide (308) and a fourth horizontal linear guide (308) near an opposite edge loosely coupled to said second horizontal linear guide (308) such that the second plate (310) may horizontally slide over the table base (306) in a first horizontal direction; and a second actuator (311) for horizontally sliding the second plate (310) against the table base (306) in said first horizontal direction.

5. The radial wire bonder of claim 4 wherein the second plate (310) has a fifth horizontal linear guide (316) near a third edge and a sixth horizontal linear guide (316) near an edge opposite said third edge;

and wherein the radial wire bonder (300) further comprises:

a third plate (318) having a seventh horizontal linear guide (316) near one edge loosely coupled to said fifth horizontal linear guide (316) and an eighth horizontal linear guide (316) near an opposite edge loosely coupled to said sixth horizontal linear guide (316) such that the third plate (318) may horizontally slide over the second plate (310) in a second horizontal direction perpendicular to said first horizontal direction; and a third actuator (319) coupled to the third plate (318) for horizontally sliding the third plate (318) against the second plate (310) in said second horizontal direction.

6. The radial wire bonder of claim 5 wherein the radial wire bonder (300) further comprises:

a fourth actuator (327) coupled to the turning plate (343) for rotating the bonding head (302) into alignment with a wire path from a bonding pad (130) to a contact point (132).

7. The radial wire bonder of claim 6 wherein, the first plate (506) is a Z-sliding plate (506) having a first vertical linear guide (504) near a vertical edge and a second vertical linear guide (504) near an opposite vertical edge; and the radial wire bonder (300) further comprises:

a support bracket (502) coupled to the turning plate (343) at a top end and having a third vertical linear guide (504) near a vertical edge loosely coupled to said first vertical linear guide (504) and a fourth vertical linear guide (504) near an opposite vertical edge loosely coupled to said second vertical linear guide (504) such that the Z-sliding plate (506) may vertically slide against the support bracket (502); and a fifth actuator (507) coupled to the support bracket (502) for vertically sliding the Z-sliding plate (506) against the support bracket (502).

* * * * *